(12) United States Patent
Cai et al.

(10) Patent No.: US 8,815,669 B2
(45) Date of Patent: Aug. 26, 2014

(54) METAL GATE STRUCTURES FOR CMOS TRANSISTOR DEVICES HAVING REDUCED PARASITIC CAPACITANCE

(71) Applicant: International Business Machines Corporation, Armonk, NY (US)

(72) Inventors: Jin Cai, Cortlandt Manor, NY (US); Chengwen Pei, Danbury, CT (US); Robert R. Robison, Colchester, VT (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/775,436

(22) Filed: Feb. 25, 2013

(65) Prior Publication Data

US 2014/0138751 A1 May 22, 2014

Related U.S. Application Data

(63) Continuation of application No. 13/680,560, filed on Nov. 19, 2012, now Pat. No. 8,685,817.

(51) Int. Cl.
*H01L 21/336* (2006.01)
*H01L 29/41* (2006.01)
*H01L 29/40* (2006.01)

(52) U.S. Cl.
CPC .............. *H01L 29/41* (2013.01); *H01L 29/40* (2013.01)
USPC ........................................................ 438/197

(58) Field of Classification Search
USPC ........................................................ 438/197
See application file for complete search history.

(56) References Cited

U.S. PATENT DOCUMENTS

| | | |
|---|---|---|
| 5,241,203 A | 8/1993 | Hsu et al. |
| 5,712,503 A | 1/1998 | Kim et al. |
| 5,716,861 A | 2/1998 | Moslehi |
| 5,869,374 A | 2/1999 | Wu |
| 5,986,305 A | 11/1999 | Wu |
| 6,046,475 A | 4/2000 | Chang et al. |
| 6,124,172 A | 9/2000 | Gardner et al. |
| 6,373,088 B2 | 4/2002 | Kwok et al. |
| 6,674,139 B2 | 1/2004 | Mandelman et al. |

(Continued)

OTHER PUBLICATIONS

T. Huang et al., "A novel submicron LDD transistor with inverse-T gate structure," International Electron Devices Meeting, IEEE, 1986, vol. 32, pp. 742-745.
D. S. Wen et al., "A self-aligned inverse-T gate fully overlapped LDD device for sub-half micron CMOS," International Electron Devices Meeting, IEEE, IEDM '89, Dec. 3-6, 1989, pp. 765-768.

(Continued)

*Primary Examiner* — Charles Garber
*Assistant Examiner* — Brigitte Paterson
(74) *Attorney, Agent, or Firm* — Cantor Colburn LLP; Michael LeStrange

(57) ABSTRACT

A method of forming a field effect transistor (FET) device includes forming a gate structure over a substrate, the gate structure including a wide bottom portion and a narrow portion formed on top of the bottom portion; the wide bottom portion comprising a metal material and having a first width that corresponds substantially to a transistor channel length, and the narrow portion also including a metal material having a second width smaller than the first width.

5 Claims, 18 Drawing Sheets

(56) References Cited

U.S. PATENT DOCUMENTS

| | | | |
|---|---|---|---|
| 7,005,744 | B2 | 2/2006 | Chen et al. |
| 7,749,911 | B2 | 7/2010 | Wu et al. |
| 2001/0024859 | A1* | 9/2001 | Takahashi et al. ............ 438/286 |
| 2004/0129959 | A1* | 7/2004 | Kim et al. .................... 257/288 |
| 2008/0070356 | A1* | 3/2008 | Brown et al. ................. 438/197 |
| 2011/0256675 | A1* | 10/2011 | Avouris et al. ............... 438/197 |

OTHER PUBLICATIONS

U.S. Appl. No. 13/680,560; Non-Final Office Action; Date Filed: Nov. 19, 2012; Date Mailed: Jun. 28, 2013; pp. 1-9.

U.S. Appl. No. 13/680,560; Notice of Allowance; Date Filed: Nov. 19, 2012; Date of Mailing: Nov. 20, 2013; pp. 1-11.

* cited by examiner

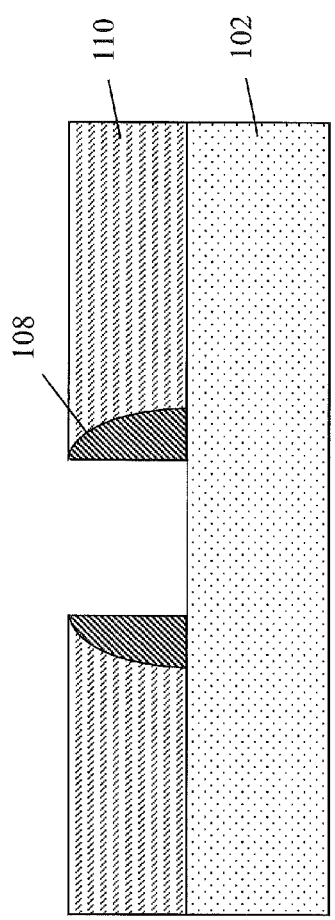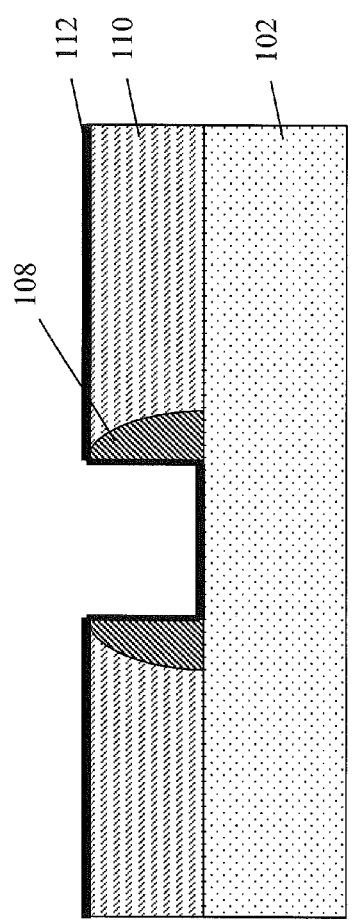

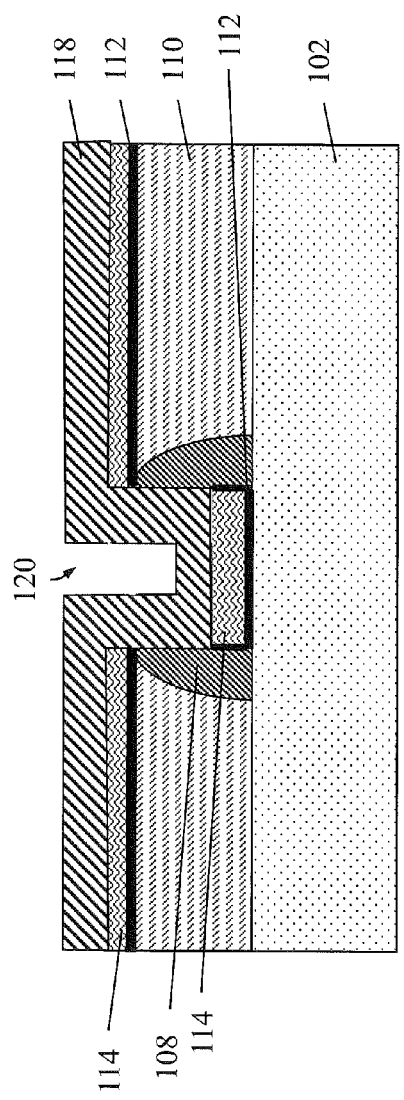
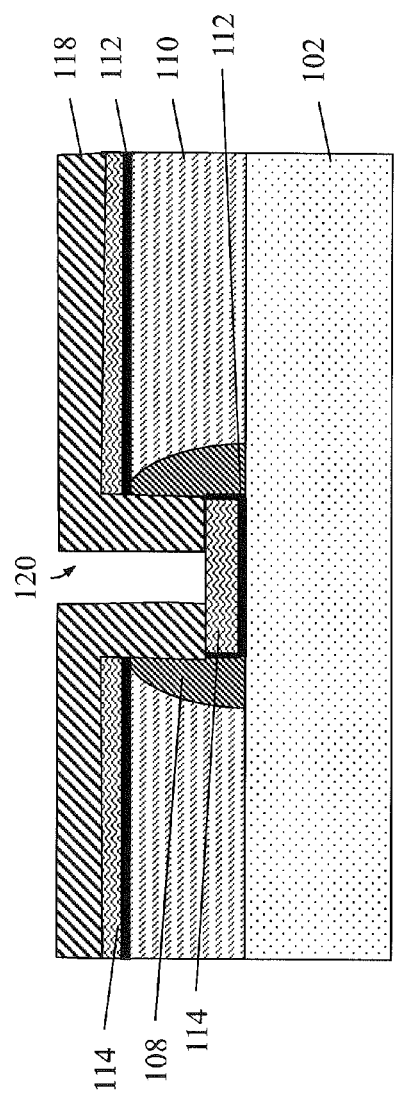
Figure 19
Figure 20

METAL GATE STRUCTURES FOR CMOS TRANSISTOR DEVICES HAVING REDUCED PARASITIC CAPACITANCE

CROSS-REFERENCE TO RELATED APPLICATION

This application is a continuation of U.S. patent application Ser. No. 13/680,560, filed Nov. 19, 2012, the disclosure of which is incorporated by reference herein in its entirety.

BACKGROUND

The present disclosure relates generally to semiconductor device manufacturing techniques and, more particularly, to metal gate structures for complementary metal-oxide semiconductor (CMOS) transistor devices having reduced gate-to-contact parasitic capacitance.

Field effect transistors (FETs) are widely used in the electronics industry for switching, amplification, filtering, and other tasks related to both analog and digital electrical signals. Most common among these are metal-oxide-semiconductor field-effect transistors (MOSFET or MOS), in which a gate structure is energized to create an electric field in an underlying channel region of a semiconductor body, by which electrons or holes are allowed to travel through the channel between a source region and a drain region of the semiconductor body. Complementary MOS (CMOS) devices have become widely used in the semiconductor industry, wherein both n-type and p-type (NMOS and PMOS) transistors are used to fabricate logic and other circuitry.

The source and drain regions of an FET are typically formed by adding dopants to targeted regions of a semiconductor body on either side of the channel. A gate structure is formed above the channel, which includes a gate dielectric located over the channel and a gate conductor above the gate dielectric. The gate dielectric is an insulator material, which prevents large leakage currents from flowing into the channel when a voltage is applied to the gate conductor, while allowing the applied gate voltage to set up a transverse electric field in the channel region in a controllable manner. Conventional MOS transistors typically include a gate dielectric formed by depositing or by growing silicon dioxide ($SiO_2$) or silicon oxynitride (SiON) over a silicon wafer surface, with doped polysilicon formed over the $SiO_2$ to act as the gate conductor.

Continuing trends in semiconductor device manufacturing include reduction in electrical device feature sizes (i.e., scaling), as well as improvements in device performance in terms of device switching speed and power consumption. MOS transistor performance may be improved by reducing the distance between the source and the drain regions under the gate conductor of the device, known as the gate or channel length, and by reducing the thickness of the layer of gate dielectric that is formed over the semiconductor surface. However, there are electrical and physical limitations on the extent to which the thickness of $SiO_2$ gate dielectrics can be reduced. For example, thin $SiO_2$ gate dielectrics are prone to gate tunneling leakage currents resulting from direct tunneling of electrons through the thin gate dielectric.

Scaling of the gate dielectric is a challenge in improving performance of advanced field effect transistors. In a field effect transistor employing a silicon oxide based gate dielectric, the leakage current through the gate dielectric increases exponentially with the decrease in the thickness of the gate dielectric. Such devices typically become too leaky to provide high performance at or below a thickness of about 1.1 nanometers (nm) for a silicon oxide gate dielectric.

Accordingly, recent MOS and CMOS transistor scaling efforts have focused on high-k dielectric materials having dielectric constants greater than that of $SiO_2$ (e.g., greater than about 3.9). High-k dielectric materials can be formed in a thicker layer than scaled $SiO_2$, and yet still produce equivalent field effect performance. The relative electrical performance of such high-k dielectric materials is often expressed in terms of equivalent oxide thickness (EOT), since the high-k material layer may be thicker, while still providing the equivalent electrical effect of a much thinner layer of $SiO_2$. Because the dielectric constant "k" is higher than silicon dioxide, a thicker high-k dielectric layer can be employed to mitigate tunneling leakage currents, while still achieving the equivalent electrical performance of a thinner layer of thermally grown $SiO_2$.

SUMMARY

In an exemplary embodiment, a method of forming a field effect transistor (FET) device includes forming a gate structure over a substrate, the gate structure comprising a wide bottom portion and a narrow portion formed on top of the bottom portion; the wide bottom portion including a metal material and having a first width that corresponds substantially to a transistor channel length, and the narrow portion also including a metal material having a second width smaller than the first width.

In another embodiment, a field effect transistor (FET) device includes a gate structure formed over a substrate, the gate structure comprising a wide bottom portion and a narrow portion formed on top of the bottom portion; the wide bottom portion including a metal material and having a first width that corresponds substantially to a transistor channel length, and the narrow portion also including a metal material having a second width smaller than the first width.

BRIEF DESCRIPTION OF THE SEVERAL VIEWS OF THE DRAWINGS

Referring to the exemplary drawings wherein like elements are numbered alike in the several Figures:

FIGS. 1 through 18 are a series of cross sectional views illustrating a method of forming an FET device in accordance with an exemplary embodiment, in which:

FIG. 1 illustrates a substrate having a dummy gate layer formed thereon;

FIG. 2 illustrates pattering of the dummy gate layer to form a dummy gate structure;

FIG. 3 illustrates the formation of gate sidewall spacers on the dummy gate structure;

FIG. 4 illustrates the formation of a first middle-of-line (MOL) dielectric layer;

FIG. 5 illustrates removal of the dummy gate structure;

FIG. 6 illustrates the formation of an interfacial oxide layer and a high-k dielectric layer;

FIG. 7 illustrates the deposition of a first metal layer;

FIG. 8 illustrates an etch process to remove vertical portions of the first metal layer and the high-k dielectric layer;

FIG. 9 illustrates formation of a planarizing layer;

FIG. 10 illustrates planarization of the planarizing layer, horizontal portions of the first metal layer, high-k dielectric layer and interfacial oxide layer to expose top surfaces of the first MOL dielectric layer;

FIG. 11 illustrates removal of the remaining portions of the planarizing layer to re-expose a gate trench opening;

FIG. 12 illustrates the deposition of a dielectric layer over the structure of FIG. 11 to reduce a diameter of the gate trench opening;

FIG. 13 illustrates a directional etch to expose a top surface of the first metal layer in the gate region;

FIG. 14 illustrates a second metal fill process to form a second metal layer over the structure of FIG. 13;

FIG. 15 illustrates a patterned resist layer formed over the second metal layer, which pattern corresponds to the original dummy gate region;

FIG. 16 illustrates etching the resist pattern into the second metal layer so as to form an I-shaped metal gate structure;

FIG. 17 illustrates the formation of a second MOL dielectric layer;

FIG. 18 illustrates the formation of source/drain contacts for the structure of FIG. 17;

FIGS. 19 through 24 are a series of cross sectional views illustrating a method of forming an FET device in accordance with another exemplary embodiment, in which:

FIG. 19 illustrates the deposition of a dielectric layer over the structure of FIG. 8 to reduce a diameter of the gate trench opening;

FIG. 20 illustrates a directional etch to expose a top surface of the first metal layer in the gate region;

FIG. 21 illustrates a second metal fill process to form a second metal layer over the structure of FIG. 20;

FIG. 22 illustrates planarization of horizontal portions of the second metal layer, the dielectric layer, the first metal layer, the high-k dielectric layer and interfacial oxide layer to expose top surfaces of the first MOL dielectric layer, so as to form an inverted T-shaped metal gate structure;

FIG. 23 illustrates the formation of a second MOL dielectric layer;

FIG. 24 illustrates the formation of source/drain contacts for the structure of FIG. 23;

FIGS. 25 through 35 are a series of cross sectional views illustrating a method of forming an FET device in accordance with another exemplary embodiment, in which:

FIG. 25 illustrates a substrate having a gate stack layer formed thereon;

FIG. 26 illustrates patterning of the gate stack layer to form an initial gate structure;

FIG. 27 illustrates the formation of gate sidewall spacers on the initial gate structure;

FIG. 28 illustrates the formation of a first MOL dielectric layer;

FIG. 29 illustrates removal of a portion of the first metal gate layer of the initial gate structure;

FIG. 30 illustrates the deposition of a dielectric layer over the structure of FIG. 29 to reduce a diameter of the gate trench opening;

FIG. 31 illustrates a directional etch to expose a top surface of the first metal layer in the gate region;

FIG. 32 illustrates a second metal fill process to form a second metal layer over the structure of FIG. 31;

FIG. 33 illustrates planarization of horizontal portions of the second metal layer to expose top surfaces of the dielectric layer, so as to form an inverted T-shaped metal gate structure;

FIG. 34 illustrates the formation of a second MOL dielectric layer;

FIG. 35 illustrates the formation of source/drain contacts for the structure of FIG. 34.

DETAILED DESCRIPTION

Figure 1:
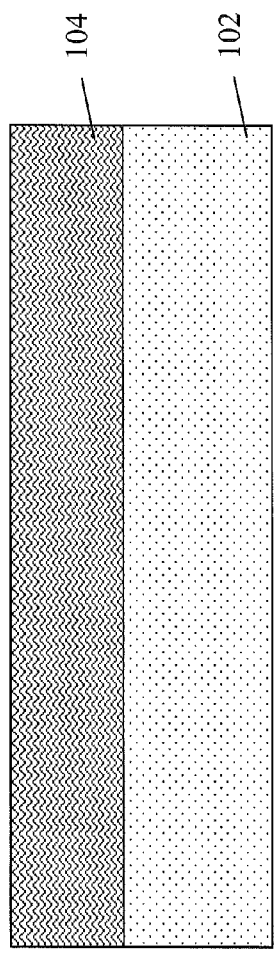

The parasitic gate capacitance of an FET reduces the performance of the transistor by reducing the switching speed. Specifically, the capacitive coupling of a gate electrode to adjacent circuit components limits the rate at which the voltage of the gate electrode may be changed. The delay in the changes in the gate voltage due to the capacitive coupling with adjacent circuit components is then reflected in an increase in a turn-on time and a turn-off time of the FET.

All transistors with a gate electrode, including MOSFETs, are prone to this type of parasitic capacitive coupling to adjacent circuit components by design. Particularly, high performance MOSFETs, in which contact vias to the source and drain regions are located close to the gate electrode to minimize the parasitic resistance of the source and drain region, suffer from high parasitic capacitance between the gate electrode and the contact vias due to their physical proximity.

Since both the gate electrode and the contact vias are physical structures, the parasitic capacitance may be reduced by scaling the dimensions of the gate electrode, the contact vias, or both. In one approach, the parasitic capacitance between the gate dielectric and a contact via may be reduced by reducing the height of the contact via. The reduction in the parasitic capacitance in this case is less than linear to the decrease in the height of the contact via since an M1 level (first level) metal wire moves close to the gate conductor correspondingly as the height of the contact via decreases, thereby increasing the parasitic capacitance between the gate conductor and the M1 line.

Semiconductor-on-insulator (SOI) devices, such as silicon-on-insulator devices, offer several advantages over more conventional semiconductor devices. For example, SOI devices may have lower power consumption requirements than other types of devices that perform similar tasks. SOI devices may also have lower parasitic capacitances than non-SOI devices. This translates into faster switching times for the resulting circuits. In addition, the phenomenon of latch up, which is often exhibited by complementary metal-oxide semiconductor (CMOS) devices, may be avoided when circuit devices are manufactured using SOI fabrication processes. SOI devices are also less susceptible to the adverse effects of ionizing radiation and, therefore, tend to be more reliable in applications where ionizing radiation may cause operation errors. Ultrathin body MOSFETs, such as ETSOI (extremely thin SOI) devices, are considered viable options for CMOS scaling for the 22 nanometer (nm) node and beyond. For these devices, it is especially desirable to be able to reduce gate-to-source/drain contact (PC-CA) parasitic capacitance.

Accordingly, disclosed herein are methods and corresponding structures for CMOS transistor devices having reduced PC-CA parasitic capacitance.

Referring initially to FIGS. 1 through 18, there are shown a series of cross sectional views a method of forming an FET device in accordance with an exemplary embodiment. In the illustrative embodiments described, the devices are fabricated using high-k, metal gate (HKMG) techniques, although it will be appreciated that other gate material technologies may also be used.

As shown in FIG. 1, a substrate 102 has a dummy gate layer 104 formed thereon, in accordance with gate last or replacement metal gate (RMG) process flow. In other embodiments described hereinafter, a gate first process flow is used as an example. The substrate 102 may include any suitable semiconductor substrate known in the art such as, but not limited to, a bulk semiconductor substrate, an SOI substrate, or an ETSOI substrate. In the case of an SOI or an ETSOI substrate, only the uppermost semiconductor-on-insulator layer portion is depicted in the figures. That is, the buried oxide (BOX) layer and the bulk substrate layer are not depicted. In any case, the semiconductor material of the substrate 102 may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The dummy gate stack 104 may include a material such as polysilicon, for example.

Figure 2:
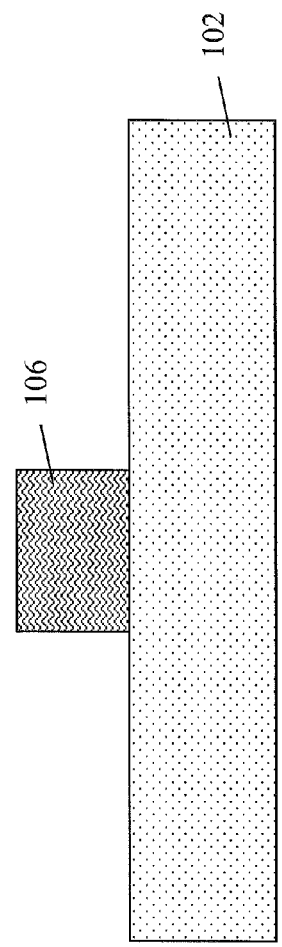
Figure 3:
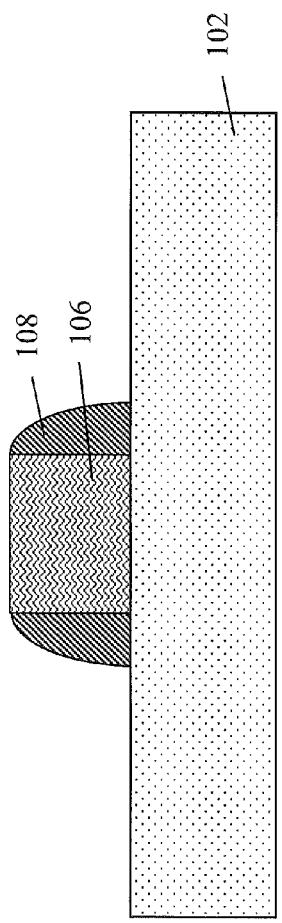
Figure 4:
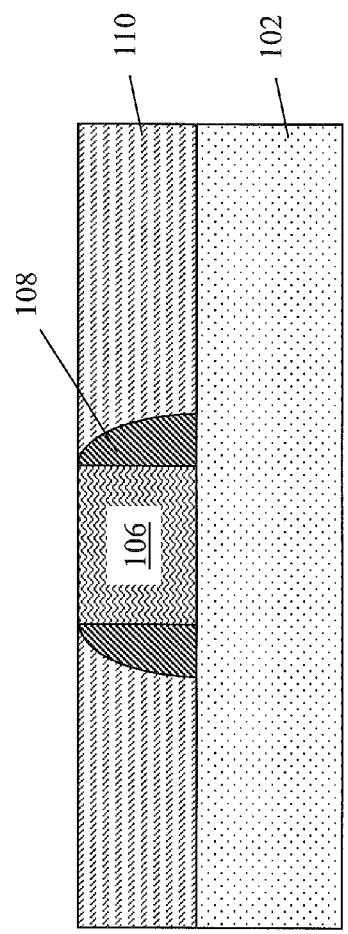

In FIG. 2, the dummy gate layer 104 is lithographically patterned and etched to form a dummy gate structure 106. Then, as shown in FIG. 3, sidewall spacers 108 (e.g., nitride) are formed adjacent the dummy gate structure as known in the art. At this point, source/drain halo and extension implants (not shown) may be defined in the substrate 102 as also known in the art. After substrate doping is performed, a first middle-of-line (MOL) dielectric layer 110 (e.g., nitride) is formed over the device, followed by planarization to expose the top surface of the dummy gate structure 106 as shown in FIG. 4.

Referring to FIG. 5, the dummy gate structure is then removed by an etch process, in preparation for the gate material formation. In FIG. 6, a gate dielectric layer 112 is formed over the structure, including top surfaces of the first MOL dielectric layer 110, sidewalls of the spacers 108, and the exposed portion of the substrate 102. The gate dielectric layer 112 may be, for example, a high-k dielectric layer including, for example, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Although not specifically illustrated in FIG. 6, an interfacial oxide layer may formed on the exposed semiconductor surface of the substrate 102 between the spacers 108, prior to the high-k layer deposition. In an exemplary embodiment, an interfacial oxide layer may be formed by a chemical oxide process such as by a wet chemical oxidation, by atomic layer deposition (ALD) of $SiO_2$ or by rapid thermal anneal (RTA) in an $O_2$ or $NH_3$ ambient environment. The formation of an interfacial oxide layer allows for nucleation of a high-k dielectric layer 112 formed thereon, which includes a dielectric metal oxide having a dielectric constant that is greater than the dielectric constant (7.5) of silicon nitride.

Figure 7:
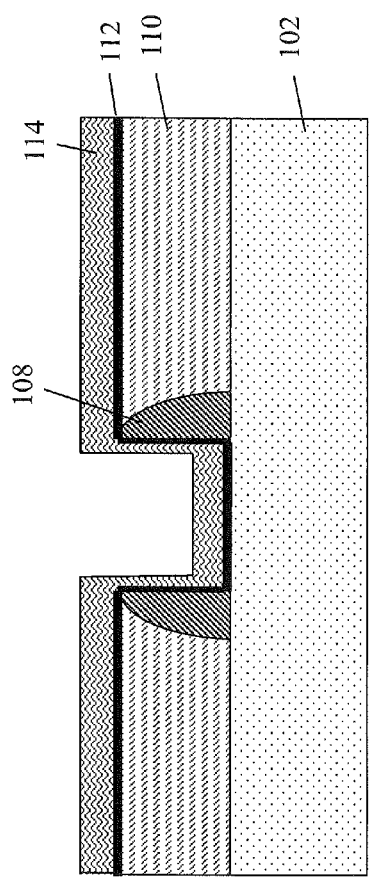

Proceeding to FIG. 7, a first metal deposition operation is performed so as to form a metal layer 114 over the high-k dielectric layer 112. The metal layer 114 may include one or more individual layers such as a conductive transition metal nitride or a conductive transition metal carbide. For example, appropriate metallic compound layers may be selected from the group of TiN, TiC, TaN, TaC, and combinations thereof. As used herein, transition metals include elements from Group 3B, 4B, 5B, 6B, 7B, 8B, 1B, and 2B and lanthanides and actinides in the periodic table of elements. In forming the metal layer 114, a physical vapor deposition (PVD) process may be used such that the resulting layer is thicker on horizontal surfaces and thinner on the vertical sidewall surfaces of the high-k dielectric layer 112.

Figure 8:
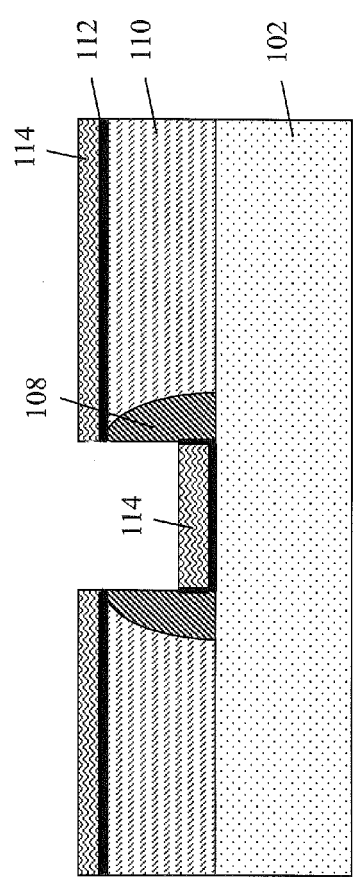

In FIG. 8, an etch process is then used to remove the vertical sidewall portions of the metal layer 114 which is much thinner than horizontal portions, so that the thicker horizontal portions are merely thinned from their original thickness. This etch may be performed using a dilute Aqua Regia solution (e.g., $3HCl:HNO_3:2H_2O$), at a temperature of about 30° C. Exposed vertical portions of the high-k dielectric layer 112 (and possibly the interfacial oxide layer) left unprotected by the metal layer are also removed from the vertical spacers 108.

Figure 9:
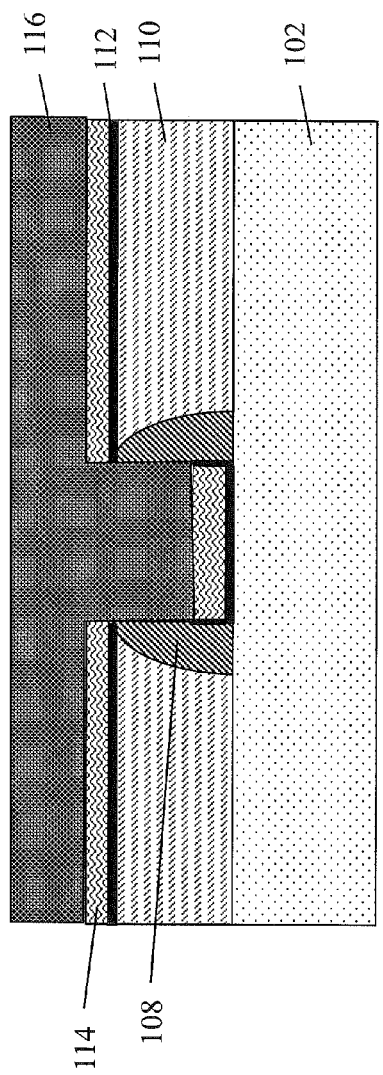
Figure 10:
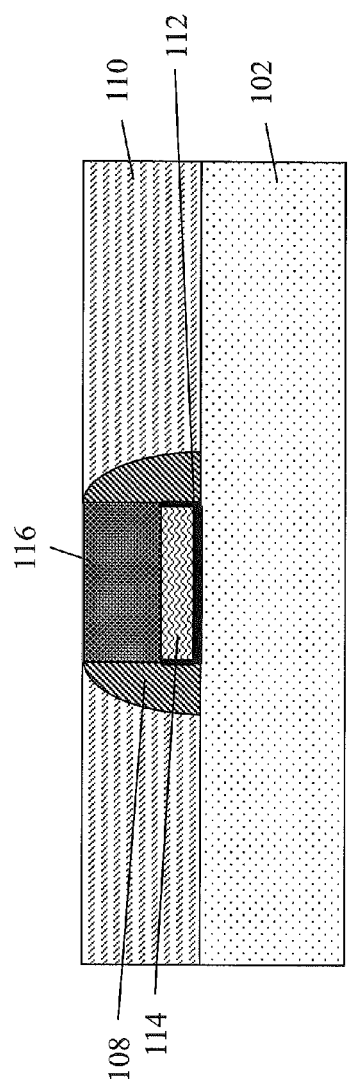

Referring to FIG. 9, in one embodiment, a planarizing layer 116 is formed over the structure, such as an organic planarizing layer (OPL) for example. Then, the planarizing layer 116 is planarized, along with horizontal portions of the metal layer 114 and the high-k layer 112 until top surfaces of the first MOL dielectric layer 110 is exposed, resulting in the structure shown in FIG. 10. A suitable etch is then employed to remove the remaining portion of the planarizing layer 116 in the gate region, as shown in FIG. 11.

Figure 11:
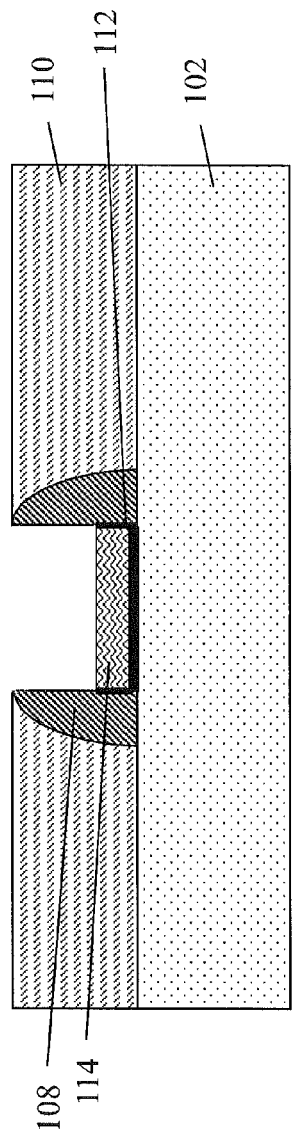
Figure 12:
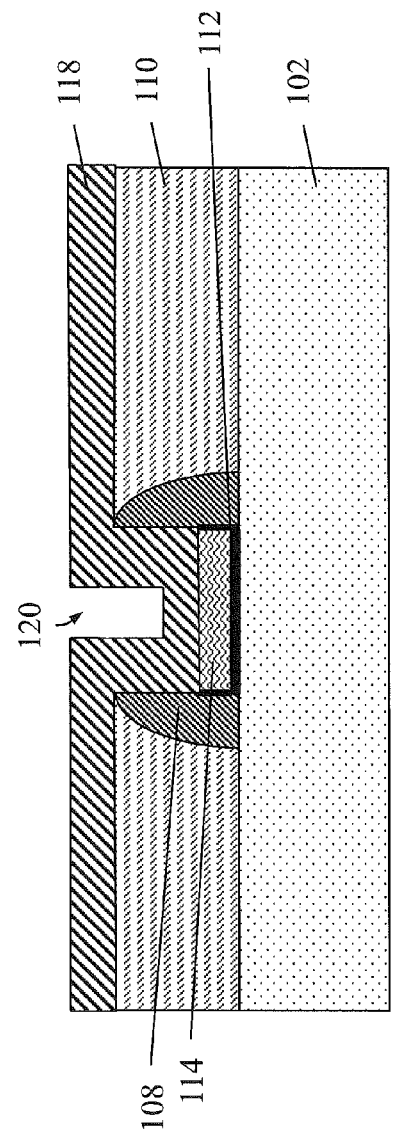
Figure 13:
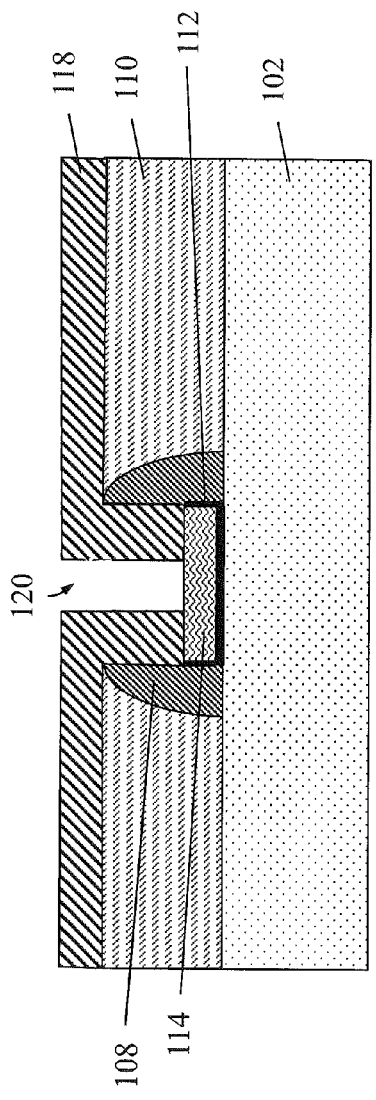
Figure 14:
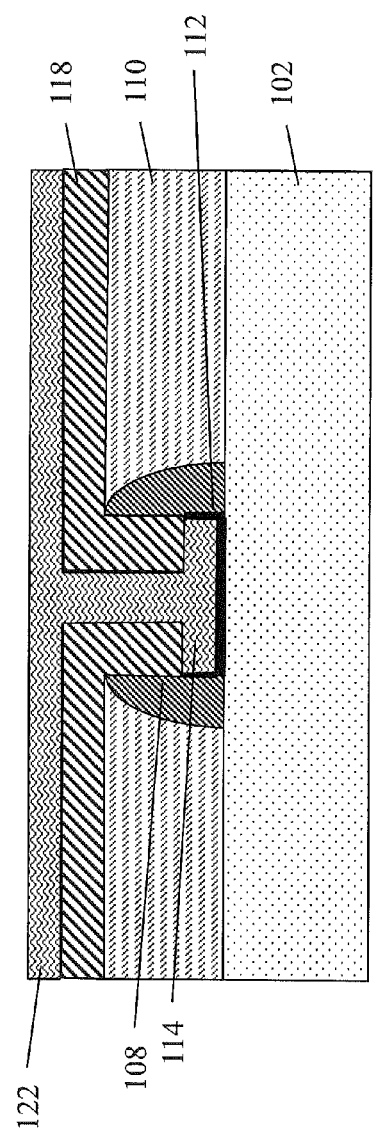

In FIG. 12, a dielectric layer 118 is uniformly deposited over the structure of FIG. 11 in a manner that reduces the diameter of the gate trench opening 120 but does not completely fill the opening. A directional etch is then used to expose a top surface of the metal layer 114 in the gate region, as shown in FIG. 13. In FIG. 14, a second metal fill process is employed to form a second metal layer 122 over the structure. This process fills the gate trench opening 120 and forms the layer 122 on a top surface of the dielectric layer 118. The metal layer 122 may, in an embodiment, comprise one or more of the same metal layer(s) with respect to the metal layer 114.

Figure 15:
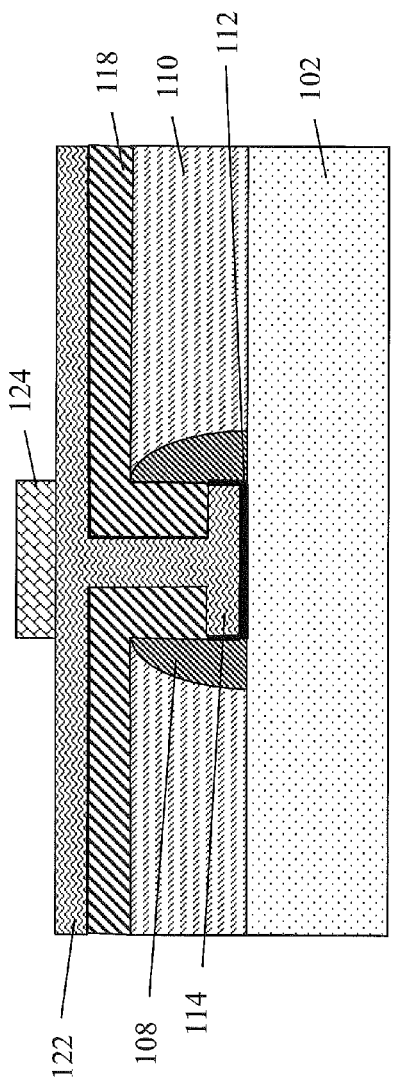
Figure 16:
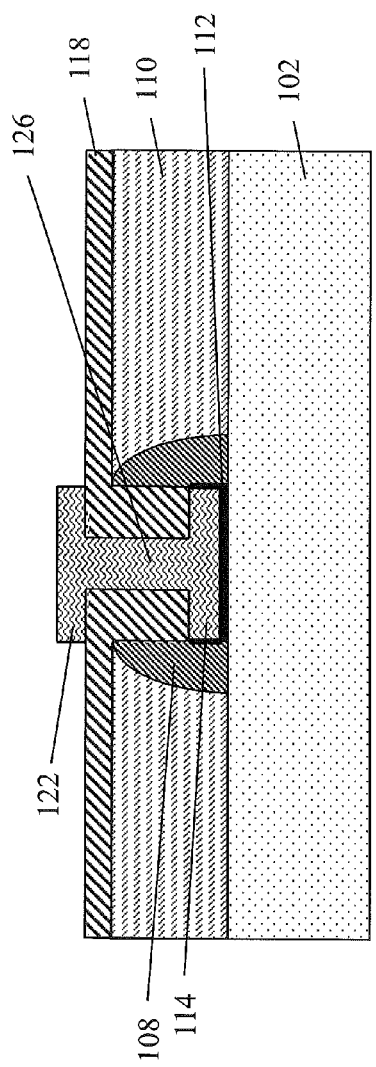
Figure 17:
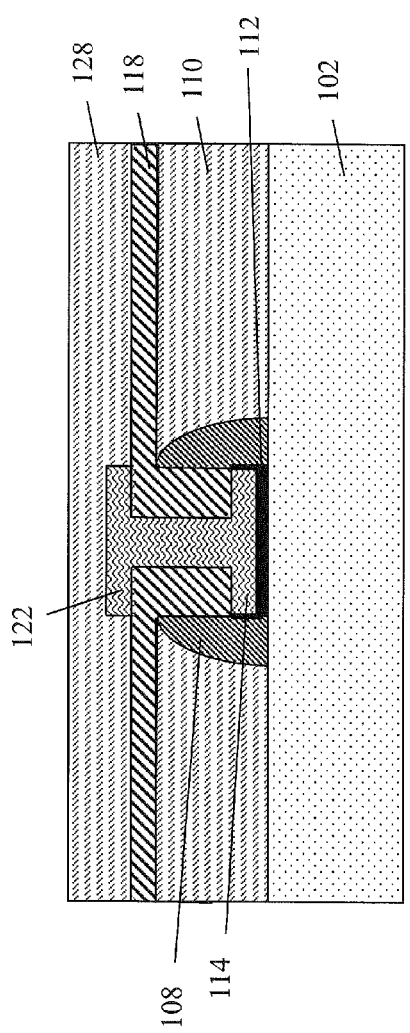
Figure 18:
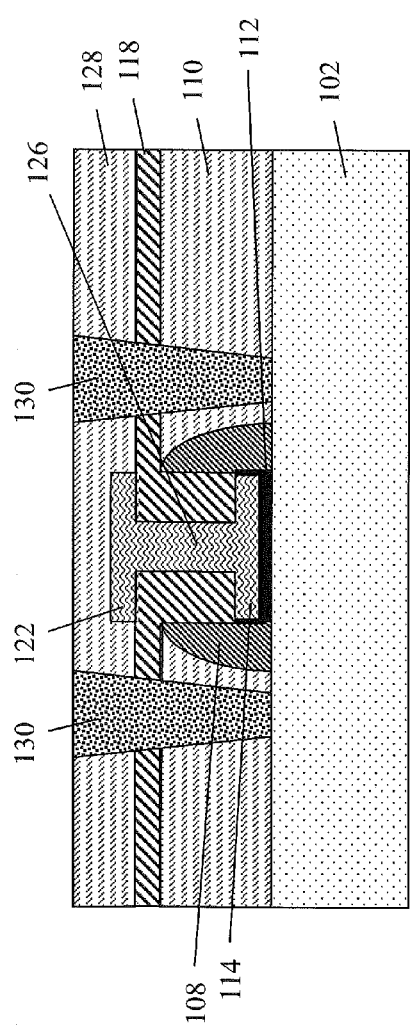

FIG. 15 illustrates a patterned resist layer 124 formed over the second metal layer 122. In one embodiment, the patterning of the resist layer corresponds to the original dummy gate region, which pattern is then transferred into the second metal layer 122 by a suitable metal etch, as shown in FIG. 16. As a result, a metal portion of the resulting gate structure assumes an "I" shape that includes a wide bottom portion (layer 114), a wide top portion (layer 122) and a narrow intermediate portion 126 between the bottom and top portions. The top and bottom portions have a first width that corresponds substantially with a transistor channel length, while the intermediate portion has a second width smaller than the first width. In an alternative embodiment, the top portion may have a third width that is greater or less than the first width, but greater than the second width. Upon completion of the metal gate processing, FIG. 17 illustrates the formation of a second MOL dielectric layer 128 over the structure of FIG. 16. Then, as illustrated in FIG. 18, source and drain contacts are formed through the MOL dielectric layers 110, 128 and the dielectric layer 118, as known in the art. At this point, regular CMOS processing as known in the art may resume.

As may be seen from the structure of FIG. 18, with respect to a conventional metal gate that occupies substantially an entire diameter of a gate trench, the I-shaped gate structure offers a lower parasitic gate-to-source/drain contact capacitance due to the narrow intermediate metal portion 126. Other configurations, however, are also contemplated. For example, FIGS. 19 through 24 are a series of cross sectional views illustrating a method of forming an FET device in accordance with another exemplary embodiment. In the following description, like elements from earlier embodiments are designated with the same reference numerals.

Figure 21:
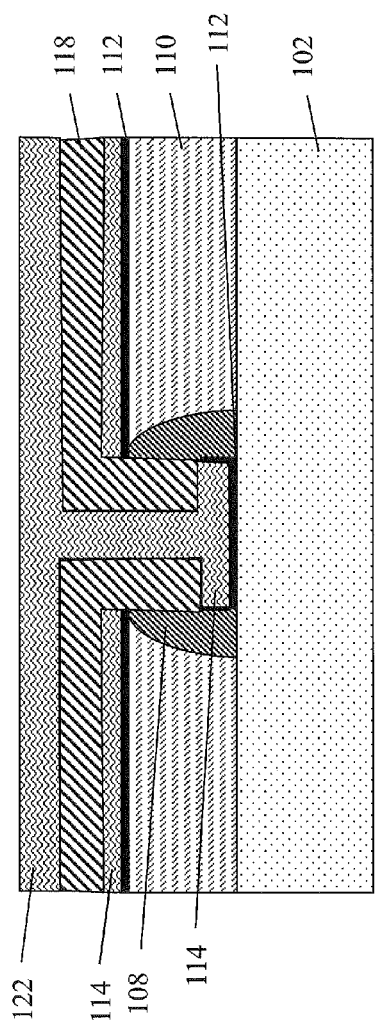

In lieu of the planarizing layer shown in FIG. 9 (after the etch process used to remove the vertical sidewall portions of the metal layer 114 in FIG. 8), FIG. 19 illustrates the deposition of the dielectric layer 118 uniformly over the structure of FIG. 8 in a manner that reduces the diameter of the gate trench opening 120, but does not completely fill the opening. A directional etch is then used to expose a top surface of the metal layer 114 in the gate region, as shown in FIG. 20. In FIG. 21, a second metal fill process is employed to form a second metal layer 122 over the structure. This process fills the gate trench opening 120 and forms the layer 122 on a top surface of the dielectric layer 118. Again, the metal layer 122 may, in an embodiment, comprise one or more of the same metal layer(s) with respect to the metal layer 114.

Figure 22:
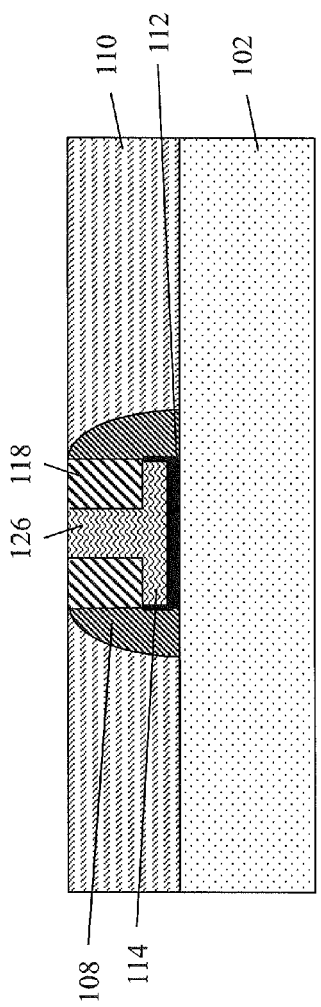
Figure 23:
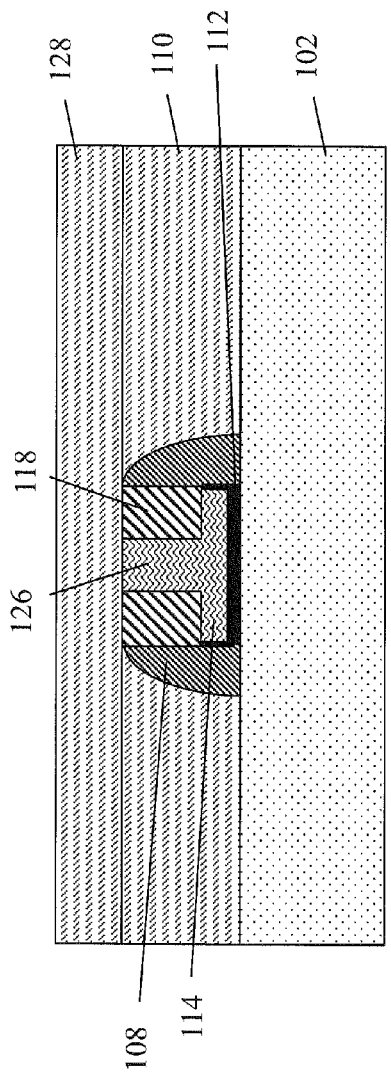
Figure 24:
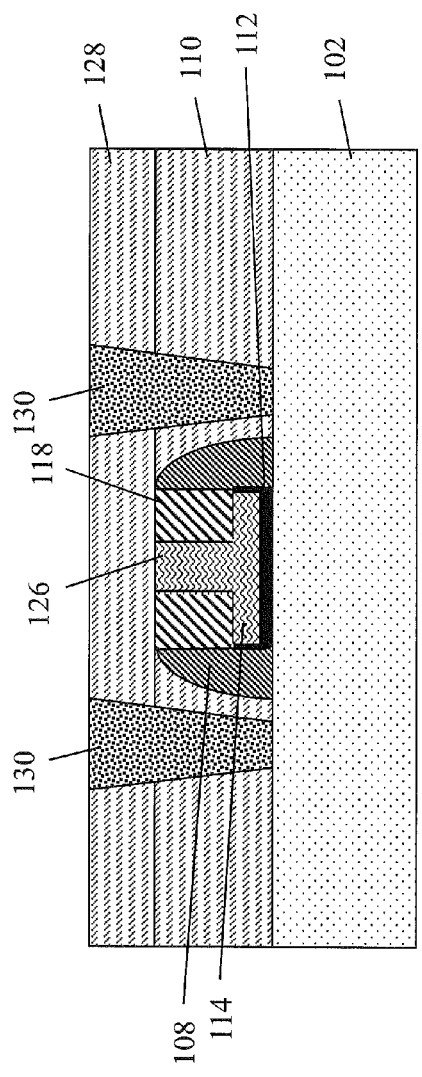

As then shown in FIG. 22, a planarization operation is then used to remove horizontal portions of the second metal layer 122, the dielectric layer 118, the first metal layer 114 and the high-k dielectric layer 112, stopping on a top surface of the first MOL dielectric layer 110. As a result, an inverted T-shaped metal gate structure is formed that includes a wide portion (layer 114) on the bottom and a narrow portion 126 atop the wide portion 114. Upon defining the T-shaped metal gate structure, a second MOL dielectric layer 128 is deposited over the device as shown in FIG. 23. As with the I-shaped embodiment, source/drain contacts 130 may then be formed as shown in FIG. 24 before continuing with existing CMOS processing techniques. Moreover, like the I-shaped gate structure, the inverted T-shaped gate structure also offers a lower parasitic gate-to-source/drain contact capacitance due to the narrow metal portion 126.

To this point, the described embodiments have been presented in the context of gate last or replacement metal gate processing. However, the gate structures herein may also be formed using gate first processing techniques. Referring generally now to FIGS. 25 through 35, there is shown a series of cross sectional views illustrating a method of forming an FET device in accordance with another exemplary embodiment. Again, for ease of description, like elements from earlier embodiments are designated with the same reference numerals.

Figure 25:
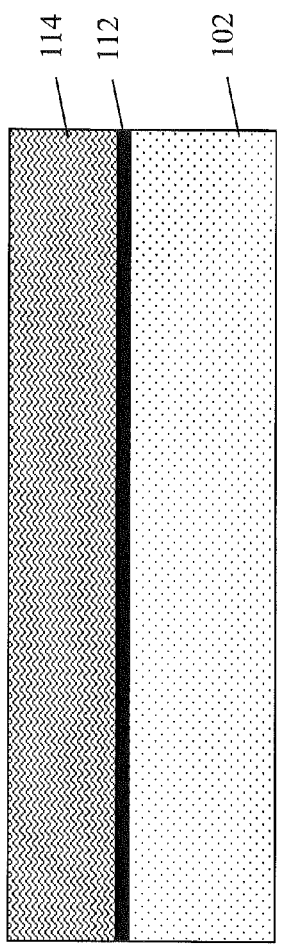
Figure 26:
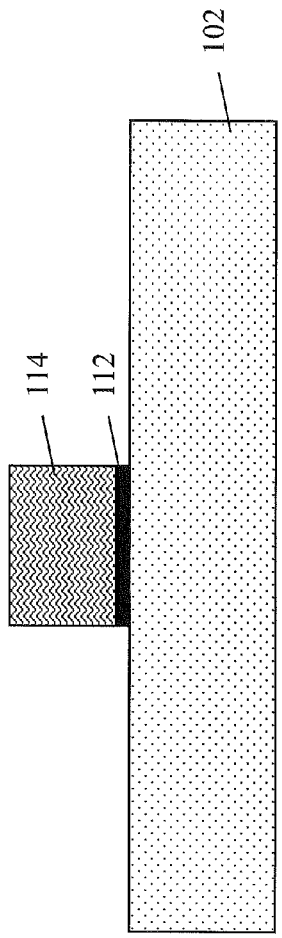
Figure 27:
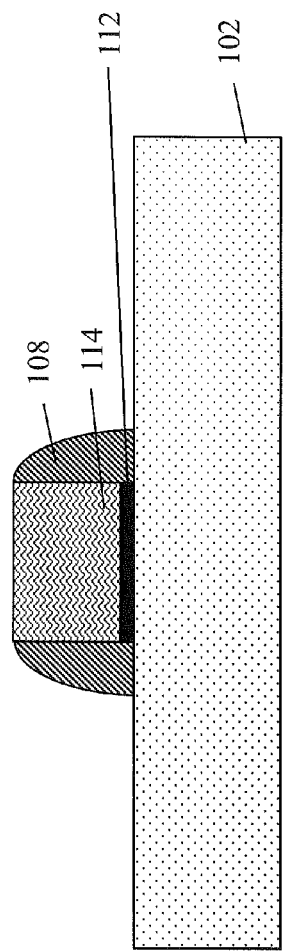
Figure 28:
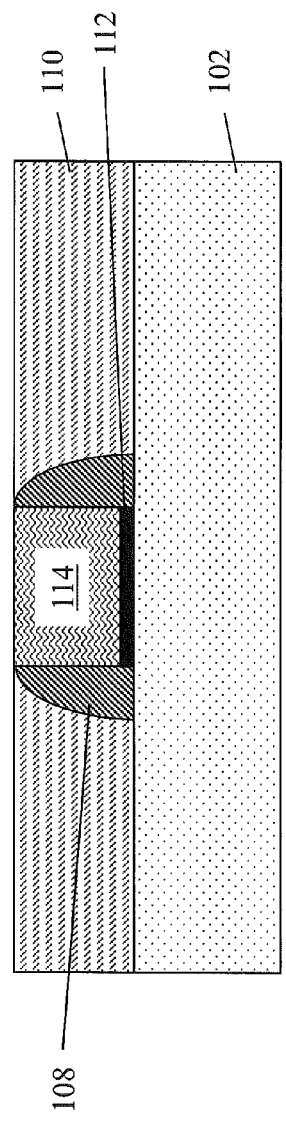

In FIG. 25, a substrate 102 has a gate stack layer formed thereon, including for example, an optional interfacial oxide layer (not shown), a high-k dielectric layer 112 and first metal layer 114. The gate stack layer is then patterned to form an initial gate structure, as shown in FIG. 26. Then, as illustrated in FIG. 27, gate sidewall spacers 108 are formed on the initial gate structure. This is followed by formation and planarization of a first MOL dielectric layer 110 in FIG. 28.

Figure 29:
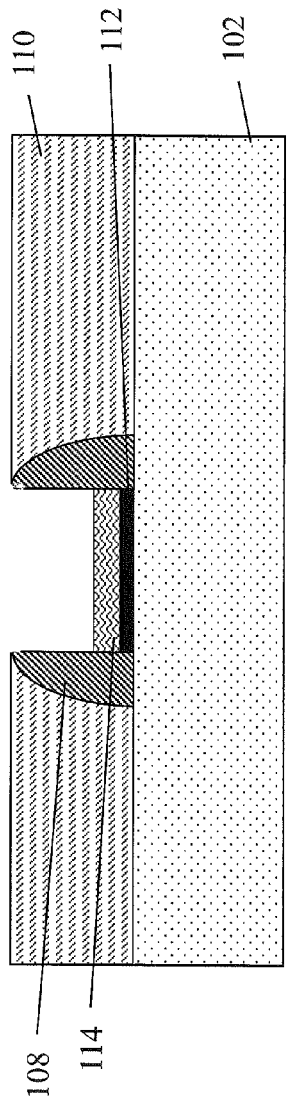
Figure 30:
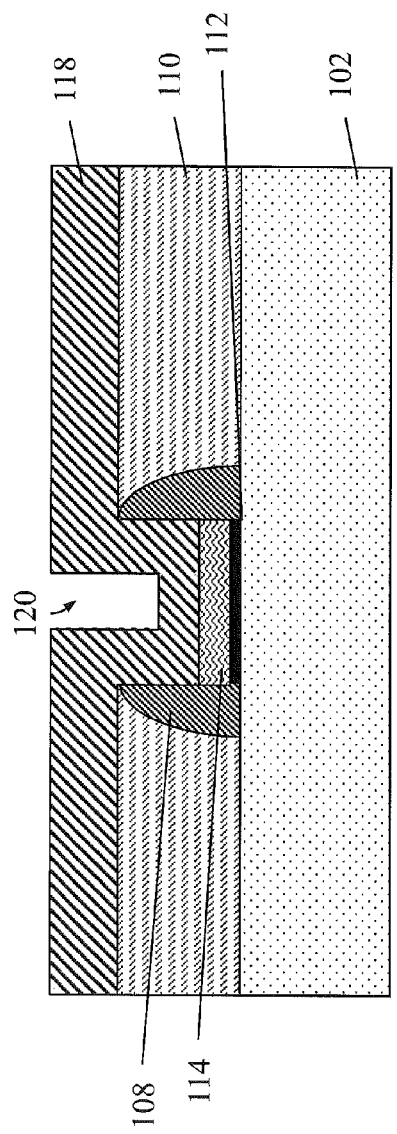
Figure 31:
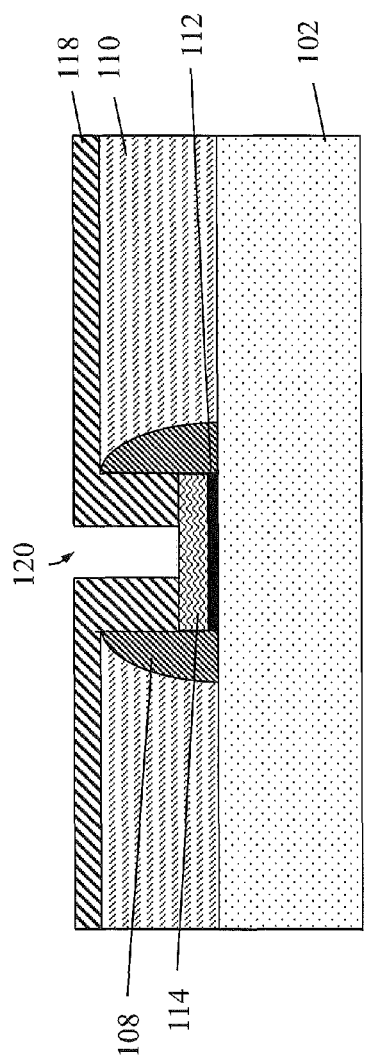
Figure 32:
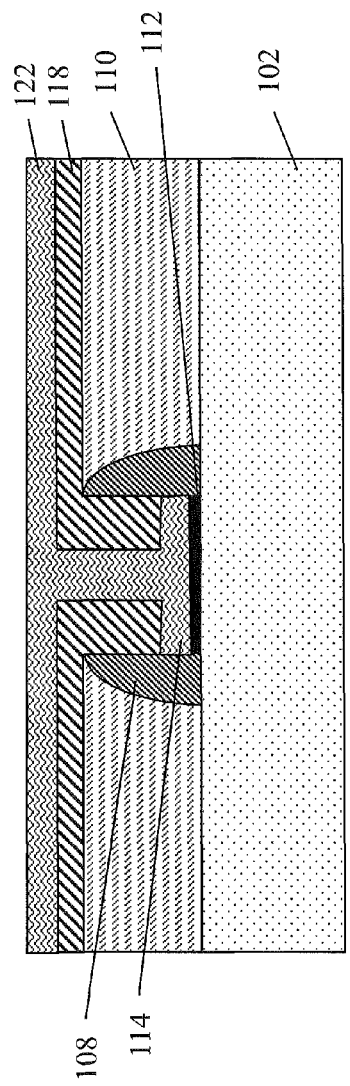

FIG. 29 illustrates the removal of a portion of the first metal gate layer 114 of the initial gate structure This may be done, for example, by a metal etch to remove some, but not all of the first metal gate layer 114. Then, as shown in FIG. 30, a dielectric layer 118 is deposited over the structure to reduce a diameter of the gate trench opening 120. A directional etch is then applied in FIG. 31 to expose a top surface of the first metal layer 114 in the gate region. In FIG. 32, a second metal fill process is performed to form a second metal layer 122 over the structure of FIG. 31.

Figure 33:
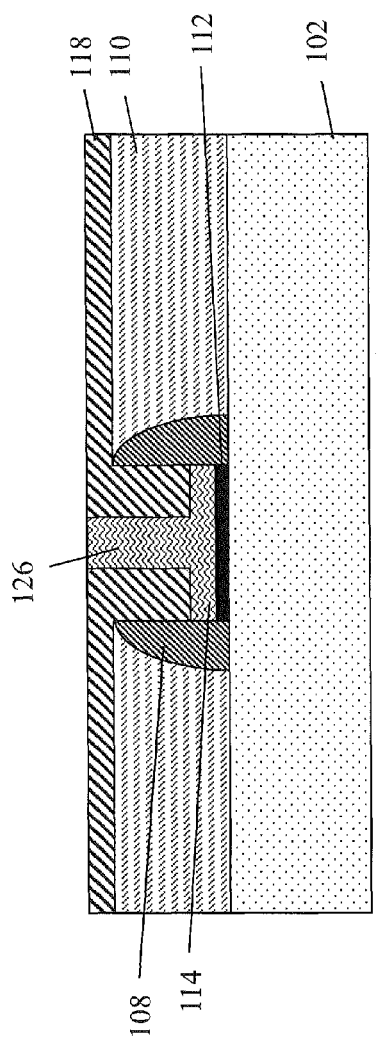
Figure 34:
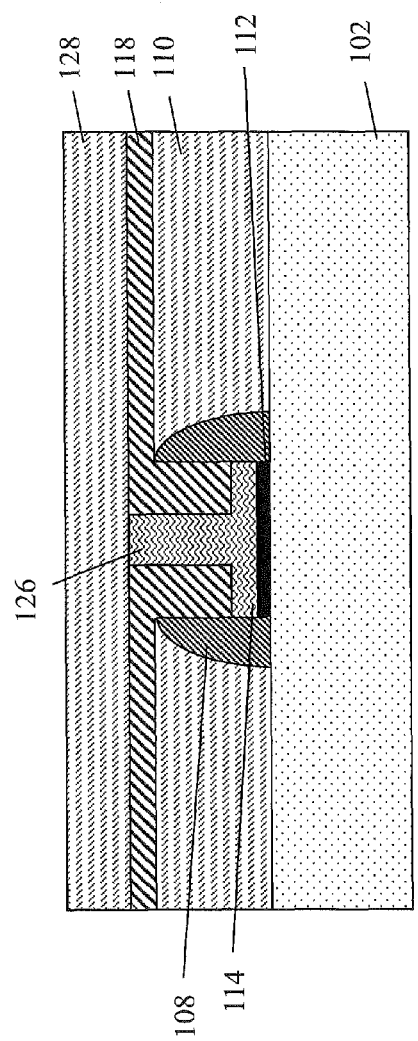
Figure 35:
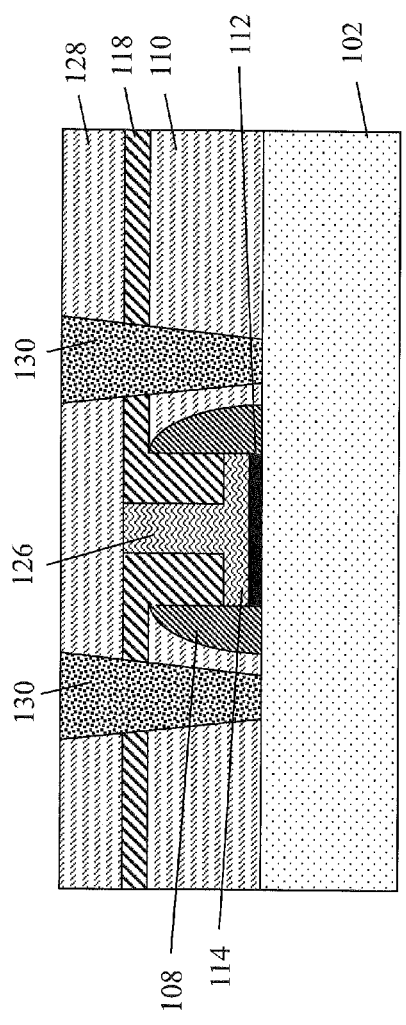

Referring to FIG. 33, planarization of horizontal portions of the second metal layer 122 are planarized to expose top surfaces of the dielectric layer 118, so as to form an inverted T-shaped metal gate structure that includes a wide portion (layer 114) on the bottom and a narrow portion 126 atop the wide portion 114. Although in the illustrated embodiment, the planarization operation stops on top of the dielectric layer 118, it will be appreciated that in an alternative embodiment, the planarization may continue through horizontal portions of the dielectric layer 118, and stopping on top of the first MOL dielectric layer 110. Upon defining the T-shaped metal gate structure, a second MOL dielectric layer 128 is deposited over the resulting device as shown in FIG. 34. Source/drain contacts 130 may then be formed as shown in FIG. 35 before continuing with existing CMOS processing techniques.

Figure 36:
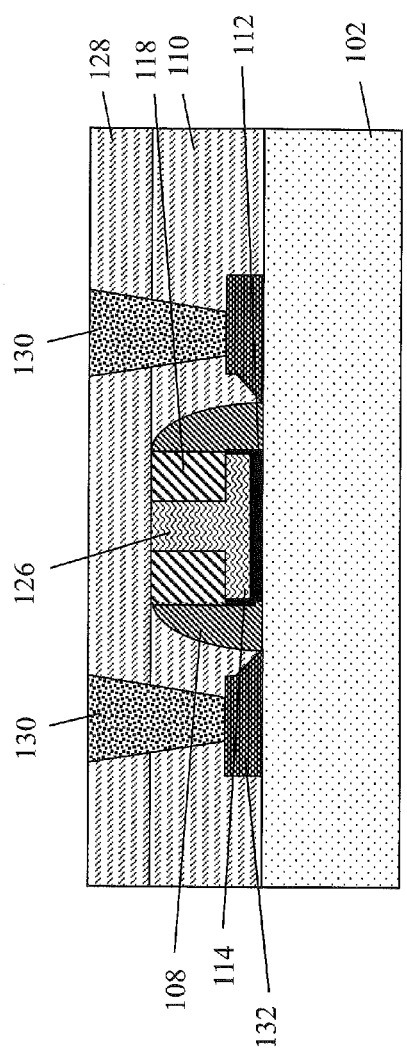
FIG. 36 illustrates a raised source/drain configuration option, in accordance with a further embodiment.

Finally, FIG. 36 illustrates a raised source/drain configuration option, in accordance with a further embodiment. Here, raised source/drain regions 132 are formed prior to MOL dielectric formation, such as by epitaxial growth of a suitable semiconductor material in the source/drain regions of the substrate adjacent the gate structure. The specific example of FIG. 36 is an example of a raised source/drain embodiment incorporated into a replacement gate process flow similar to the formation of the device of FIG. 24. However, it will be appreciated that raised source/drain regions 132 may also be incorporated for a gate first process flow, or for an I-shaped gate structure as well.

While the disclosure has been described with reference to an exemplary embodiment or embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

The invention claimed is:

1. A field effect transistor (FET) device, comprising:
   a gate structure formed over a substrate, the gate structure comprising a wide bottom portion and a narrow portion formed on top of the bottom portion;
   the wide bottom portion comprising a metal material disposed above a topmost surface of the substrate and having a first width that corresponds substantially to a transistor channel length, and the narrow portion also comprising a metal material having a second width smaller than the first width;
   the gate structure further comprising a wide top portion formed on top of the narrow portion, the wide top portion comprising a metal material having a third width that is greater than the second width;
   sidewall spacers formed in contact with a top surface of the substrate and disposed adjacent outer edges of the wide bottom portion of the gate structure, wherein the wide top portion is disposed above a top of the sidewall spacers; and
   a dielectric layer disposed between and in contact with the wide bottom portion and the wide top portion, the dielectric layer also disposed between and in contact with the narrow portion and the sidewall spacers.

2. The FET device of claim 1, wherein the gate structure comprises an I-shaped structure.

3. The FET device of claim 1, wherein the third width is the same as the first width.

4. The FET device of claim 1, further comprising source and drain contacts to the substrate formed on opposite sides of the gate structure.

5. The FET device of claim 1, further comprising raised source and drain formed on opposite sides of the gate structure.

* * * * *